(12) United States Patent
Tsutsui et al.

(10) Patent No.: US 11,368,131 B2
(45) Date of Patent: Jun. 21, 2022

(54) POWER AMPLIFIER CIRCUIT

(71) Applicant: Murata Manufacturing Co., Ltd., Kyoto (JP)

(72) Inventors: Takayuki Tsutsui, Kyoto (JP); Satoshi Tanaka, Kyoto (JP); Yasuhisa Yamamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/083,037

(22) Filed: Oct. 28, 2020

(65) Prior Publication Data
US 2021/0044263 A1 Feb. 11, 2021

Related U.S. Application Data

(63) Continuation of application No. 16/227,189, filed on Dec. 20, 2018, now Pat. No. 10,855,235.

(30) Foreign Application Priority Data

Dec. 27, 2017 (JP) .............................. JP2017-252514
May 29, 2018 (JP) .............................. JP2018-102806

(51) Int. Cl.
*H03F 3/04* (2006.01)
*H03F 3/21* (2006.01)
(Continued)

(52) U.S. Cl.
CPC ............. *H03F 3/211* (2013.01); *H03F 1/565* (2013.01); *H03F 3/195* (2013.01); *H03F 1/301* (2013.01);
(Continued)

(58) Field of Classification Search
CPC .......... H03F 3/211; H03F 3/195; H03F 1/565; H03F 1/301; H03F 1/302; H03F 2200/18;
(Continued)

(56) References Cited

U.S. PATENT DOCUMENTS 5,942,946 A * 8/1999 Su ..................... H03F 3/1935
                                                            330/310
7,250,820 B2 * 7/2007 Meck .................... H03F 1/0261
                                                            330/297
(Continued)

FOREIGN PATENT DOCUMENTS

| JP | H09-289421 A | 11/1997 |
| JP | 2014-236469 A | 12/2014 |
| WO | 2014087479 A1 | 6/2014 |

*Primary Examiner* — Khanh V Nguyen
(74) *Attorney, Agent, or Firm* — Pearne & Gordon LLP

(57) ABSTRACT

A power amplifier circuit amplifies a radio-frequency signal in a transmit frequency band. The power amplifier circuit includes an amplifier, a bias circuit, and an impedance circuit. The amplifier amplifies power of a radio-frequency signal and outputs an amplified signal. The impedance circuit is connected between a signal input terminal of the amplifier and a bias-current output terminal of the bias circuit and has frequency characteristics in which attenuation is obtained in the transmit frequency band. The impedance circuit includes first and second impedance circuits. The first impedance circuit is connected to the signal input terminal. The second impedance circuit is connected between the first impedance circuit and the bias-current output terminal.

15 Claims, 8 Drawing Sheets

(51) Int. Cl.
*H03F 3/195* (2006.01)
*H03F 1/56* (2006.01)
*H03F 1/30* (2006.01)

(52) U.S. Cl.
CPC ........ *H03F 1/302* (2013.01); *H03F 2200/165* (2013.01); *H03F 2200/18* (2013.01); *H03F 2200/222* (2013.01); *H03F 2200/237* (2013.01); *H03F 2200/411* (2013.01); *H03F 2200/451* (2013.01); *H03F 2200/48* (2013.01); *H03F 2203/21103* (2013.01); *H03F 2203/21112* (2013.01); *H03F 2203/21124* (2013.01)

(58) Field of Classification Search
CPC ........ H03F 2200/411; H03F 2200/451; H03F 2200/222; H03F 2200/237; H03F 2200/48; H03F 2203/21103; H03F 2203/21112; H03F 2203/21124; H03F 2200/165; H03F 3/245; H03F 3/19; H03F 1/26

USPC ........................................ 330/285, 296, 310
See application file for complete search history.

(56) References Cited

U.S. PATENT DOCUMENTS

| | | | |
|---|---|---|---|
| 7,265,618 B1* | 9/2007 | Meck | H03G 3/004 |
| | | | 330/251 |
| 7,345,547 B2 | 3/2008 | Wang et al. | |
| 8,624,675 B2 | 1/2014 | Lautzenhiser | |
| 8,829,999 B2* | 9/2014 | Fisher | H01L 29/402 |
| | | | 330/307 |
| 9,929,702 B2* | 3/2018 | Ma | H03F 1/3282 |
| 10,069,462 B1* | 9/2018 | Min | H01L 23/66 |
| 10,892,719 B2* | 1/2021 | Choi | H03F 1/0211 |
| 2006/0255861 A1* | 11/2006 | Ono | H03F 1/3205 |
| | | | 330/296 |
| 2015/0171797 A1 | 6/2015 | Ni et al. | |
| 2017/0077879 A1 | 3/2017 | Ma et al. | |
| 2017/0093353 A1 | 3/2017 | Lautzenhiser | |
| 2017/0127360 A1 | 5/2017 | Jeon et al. | |

* cited by examiner

FREQUENCY :1.000 [GHz]~3.000 [GHz]

FREQUENCY :1.000 [GHz]～3.000 [GHz]

POWER AMPLIFIER CIRCUIT

CROSS REFERENCE TO RELATED APPLICATIONS

This is a continuation of U.S. patent application Ser. No. 16/227,189, filed on Dec. 20, 2018, which claims priority from Japanese Patent Application No. 2017-252514, filed on Dec. 27, 2017, and which claims priority from Japanese Patent Application No. 2018-102806 filed May 29, 2018. The contents of these applications are incorporated herein by reference in their entireties.

BACKGROUND

The present disclosure relates to a power amplifier circuit. As radio communication methods used in mobile communication terminal devices, such as cellular phones and smartphones, modulation methods, such as High Speed Uplink Packet Access (HSUPA) and Long Term Evolution (LTE), are being used. In the fourth-generation (4G) mobile communication system, multiband carrier waves are being used, and it is desirable that mobile communication terminal devices also support multiple frequency bands. To implement faster and stable data communication, the bandwidth is increased with carrier aggregation (CA). As the mobile communication system is shifting from 4G to the fifth generation (5G), the circuit configuration of the front-end unit of a mobile communication terminal device is becoming more and more complicated.

As an amplifier element of a power amplifier circuit for amplifying power of a radio-frequency (RF) signal in an RF band, an amplifying transistor constituted by a heterojunction bipolar transistor (HBT) or a field-effect transistor (FET), for example, is used. If a bipolar transistor is used as the amplifying transistor, the emitter of the amplifying transistor is connected to a reference potential (ground potential, for example), a power supply voltage is supplied to the collector via a choke inductor, and an RF signal is input into the base via a coupling capacitor.

A bias circuit is connected to the base of the amplifying transistor. As in the amplifying transistor, a bias transistor provided in the bias circuit is also constituted by an HBT or an FET, for example. The bias transistor operates as an emitter follower circuit for supplying a bias current to the base of the amplifying transistor.

In accordance with the increased complexity of the front-end unit of a mobile communication terminal device, it is desirable that a power amplifier circuit, which is disposed at a stage preceding the front-end circuit, also support multiband and broadband communication. In such a mobile communication terminal device, a power amplifier module including a power amplifier circuit provided for each transmit frequency band is used. The transmit frequency band has a predetermined bandwidth including one or multiple bands according to the communication method of the mobile communication terminal device. Usually, a bias circuit is provided for the amplifying transistor forming the power amplifier circuit. Japanese Unexamined Patent Application Publication No. 2014-236469 discloses the following power amplifier. In this power amplifier, a bias circuit and a filter for blocking noise produced in the bias circuit are selectively used for plural amplifier circuits. Noise produced in the bias circuit can thus be reduced without substantially increasing the complexity of the circuit configuration.

BRIEF SUMMARY

In addition to responding to multiband and broadband communication, a power amplifier circuit used in a mobile communication terminal device is required to efficiently amplify power of an RF signal in a transmit frequency band. To efficiently amplify power of an RF signal, it is necessary to transmit an RF signal on a transmit path while minimizing the loss of the RF signal. However, due to a leakage of an RF signal from the transmit path to a supply path for a bias current, the signal level of the RF signal input into an amplifier is decreased. This makes it difficult for the amplifier to efficiently amplify power of the RF signal.

The present disclosure has been made in view of the above-described background. The present disclosure reduces a leakage of radio-frequency (RF) signals into a bias circuit so as to efficiently amplify RF signals over a wide frequency band.

According to one aspect of the disclosure, there is provided a power amplifier circuit for amplifying a radio-frequency (RF) signal in a transmit frequency band. The power amplifier circuit includes an amplifier, a bias circuit, and an impedance circuit. The amplifier amplifies power of an RF signal and outputs an amplified signal. The impedance circuit is connected between a signal input terminal of the amplifier and a bias-current output terminal of the bias circuit and has frequency characteristics in which attenuation is obtained in the transmit frequency band. The impedance circuit includes first and second impedance circuits. The first impedance circuit is connected to the signal input terminal. The second impedance circuit is connected between the first impedance circuit and the bias-current output terminal.

With this configuration, the provision of both of the first and second impedance circuits makes it possible to increase the impedance in the transmit frequency band on a path between the signal input terminal of the amplifier and the bias-current output terminal of the bias circuit, that is, the supply path for a bias current. The power amplifier circuit thus achieves a greater amount of attenuation in the transmit frequency band on the supply path for the bias current and also implements higher impedance on the supply path for the bias current over a wide frequency range. The power amplifier circuit is thus able to efficiently amplify RF signals over a wide frequency band.

According to another aspect of the disclosure, there is provided a power amplifier circuit for amplifying a radio-frequency (RF) signal in a transmit frequency band. The power amplifier circuit includes an amplifier, a bias circuit, and an impedance circuit. The amplifier amplifies power of an RF signal and outputs an amplified signal. The impedance circuit is connected between a signal input terminal of the amplifier and a bias-current output terminal of the bias circuit and has frequency characteristics in which attenuation is obtained in the transmit frequency band. The impedance circuit includes first and second inductive elements and first and second capacitive elements. The first and second inductive elements are connected in series with each other between the signal input terminal and the bias-current output terminal. The first capacitive element is connected between two terminals of a series circuit constituted by the first and second inductive elements. The second capacitive element is connected between a reference potential and a node between the first and second inductive elements. The first and second inductive elements and the first capacitive element form an LC parallel resonance circuit. The first and second inductive elements and the second capacitive element form an LC low-pass filter circuit.

With this configuration, the provision of the LC parallel resonance circuit and the LC low-pass filter circuit makes it possible to increase the impedance in the transmit frequency band on the supply path for a bias current. The LC low-pass filter circuit can increase the attenuation in a frequency range higher than the transmit frequency band. The power amplifier circuit is thus able to efficiently amplify RF signals over a wide frequency band. The impedance circuit can be formed with fewer elements and is thus reduced in circuit scale. This may decrease the size of the power amplifier circuit and may also reduce the cost thereof.

Other features, elements, characteristics and advantages of the present disclosure will become more apparent from the following detailed description of embodiments of the present disclosure with reference to the attached drawings.

DETAILED DESCRIPTION

Power amplifier circuits according to embodiments of the disclosure will be described below in detail with reference to the accompanying drawings. The embodiments are not intended to be exhaustive or to limit the disclosure to the precise forms disclosed. The embodiments are only examples, and the configurations described in the embodiments may partially be replaced by or combined with each other. Second through fourth embodiments will be discussed mainly by referring to points different from a first embodiment while omitting the same points as those of the first embodiment. Similar advantages obtained by similar configurations will not be repeated.

First Embodiment

Figure 1:
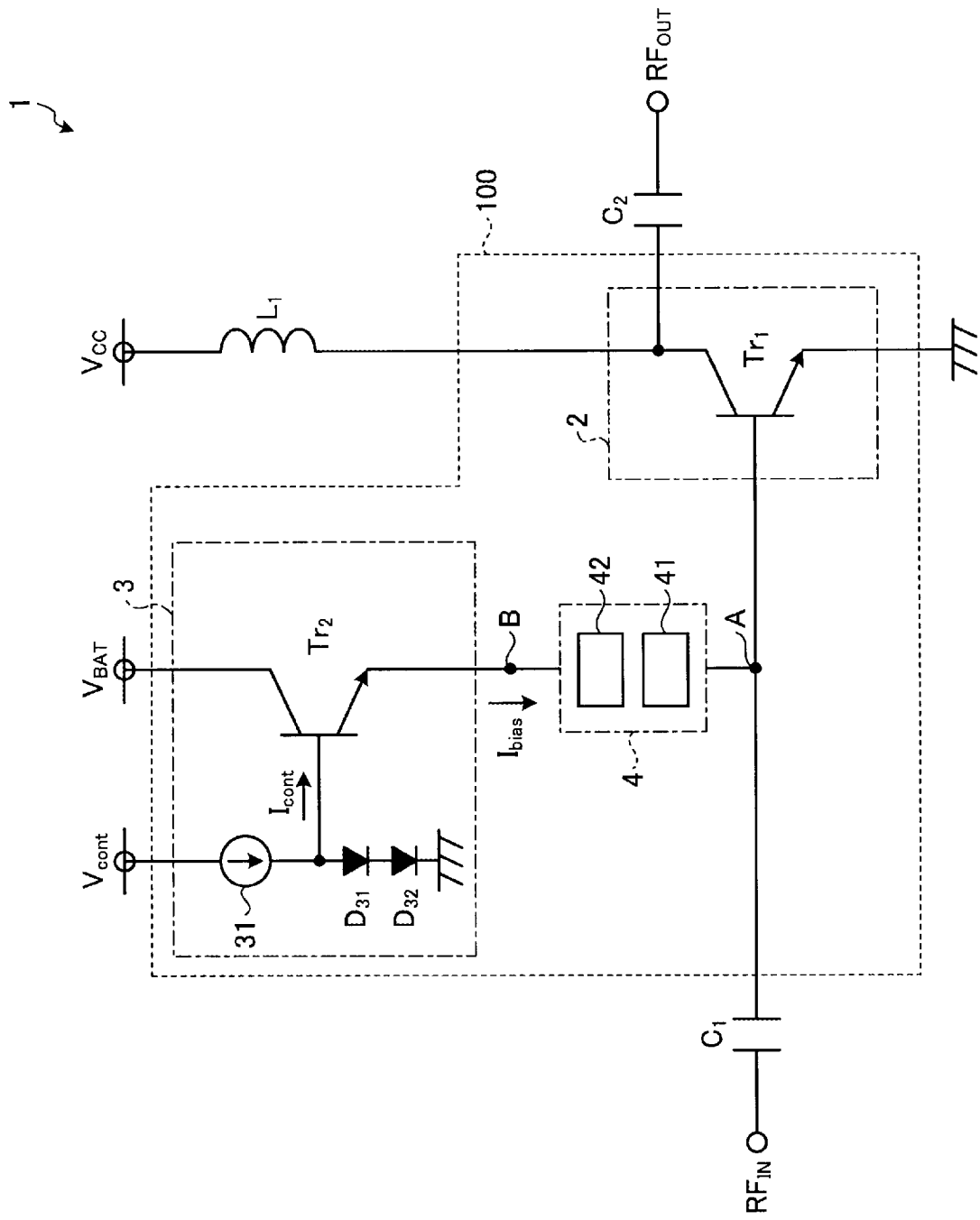
FIG. 1 is a circuit diagram illustrating an example of the configuration of a power amplifier circuit according to a first embodiment.

FIG. 1 is a circuit diagram illustrating an example of the configuration of a power amplifier circuit 1 according to a first embodiment. The power amplifier circuit 1 may be used in a mobile communication terminal device, such as a cellular phone or a smartphone, to send various signals, such as audio and data signals, to a base station.

The power amplifier circuit 1 amplifies radio-frequency (RF) signals in a transmit frequency band. The transmit frequency band has a predetermined bandwidth including one or multiple bands (multiband) according to the communication method of a mobile communication terminal device using the power amplifier circuit 1. Examples of the communication method are the third generation (3G) and the fourth generation (4G). Examples of the transmit frequency band to be amplified by the power amplifier circuit 1 are 3G/4G 2 GHz band (HB), more specifically, Band 1 (B1: transmit frequency band of 1920 to 1980 MHz), Band 2 (B2: transmit frequency band of 1850 to 1910 MHz), Band 3 (B3: transmit frequency band of 1710 to 1785 MHz), and Band 4 (B4: transmit frequency band of 1710 to 1755 MHz), and time-division multiplexing (TDD) bands, such as Band 34 (B34: transmit frequency band of 2010 to 2025 MHz) and Band 39 (B39: transmit frequency band of 1880 to 1920 MHz). The above-described transmit frequency bands are only examples, and the power amplifier circuit 1 may amplify RF signals in a transmit frequency band other than these bands.

The power amplifier circuit 1 receives an input signal $RF_{IN}$, which is an RF signal in a transmit frequency band, from a circuit that precedes the power amplifier circuit 1 (hereinafter simply called the preceding circuit) and amplifies the input signal $RF_{IN}$. The power amplifier circuit 1 then outputs the amplified signal to a circuit that is subsequent to the power amplifier circuit 1 (hereinafter simply called the subsequent circuit) as an output signal $RF_{OUT}$. As the preceding circuit, a transmit power control circuit which adjusts power of a modulated signal is used, but the preceding circuit is not limited thereto. As the subsequent circuit, a front-end circuit which performs processing, such as filtering, on the output signal $RF_{OUT}$ and transmits it to an antenna is used, but the subsequent circuit is not limited thereto.

As shown in FIG. 1, the power amplifier circuit 1 includes an amplifier 2, a bias circuit 3, an impedance circuit 4, coupling capacitors $C_1$ and $C_2$, and a choke inductor $L_1$.

The amplifier 2 amplifies the input signal $RF_{IN}$ input from the preceding circuit via the coupling capacitor $C_1$ and outputs the amplified output signal $RF_{OUT}$ to the subsequent circuit via the coupling capacitor $C_2$. The coupling capacitor $C_1$ blocks direct current (DC) components between the preceding circuit and the amplifier 2. The coupling capacitor $C_2$ blocks DC components between the amplifier 2 and the subsequent circuit.

The amplifier 2 includes an amplifying transistor $Tr_1$. As the amplifying transistor $Tr_1$, a heterojunction bipolar transistor (HBT) is used, but this is only an example.

The emitter of the amplifying transistor $Tr_1$ is connected to a reference potential. The base of the amplifying transistor $Tr_1$ is connected to one end of the coupling capacitor $C_1$. The other end of the coupling capacitor $C_1$ receives the input signal $RF_{IN}$ from the preceding circuit. The collector of the amplifying transistor $Tr_1$ is connected to one end of the coupling capacitor $C_2$. The output signal $RF_{OUT}$ is output from the other end of the coupling capacitor $C_2$ to the subsequent circuit. A power supply potential $V_{CC}$ is applied to the collector of the amplifying transistor $Tr_1$ via the choke inductor $L_1$ so that DC power is supplied to the amplifying transistor $Tr_1$. The reference potential connected to the emitter of the amplifying transistor $Tr_1$ is a ground potential in this example, but it is not restricted thereto.

The choke inductor $L_1$ has sufficiently high impedance for the transmit frequency band.

The bias circuit 3 includes a current source 31, diodes $D_{31}$ and $D_{32}$, and a bias-current supplying transistor $Tr_2$. As in the amplifying transistor $Tr_1$, an HBT may be used for the bias-current supplying transistor $Tr_2$, but this is only an example.

The cathode of the diode $D_{32}$ is connected to a reference potential. The cathode of the diode $D_{31}$ is connected to the anode of the diode $D_{32}$. The current source 31 is connected between a bias control potential $V_{cont}$ and the anode of the diode $D_{31}$. The node between the anode of the diode $D_{31}$ and the current source 31 is connected to the base of the bias-current supplying transistor $Tr_2$. Accordingly, the voltage equivalent to a voltage drop in the diodes $D_{31}$ and $D_{32}$ is applied to the base of the bias-current supplying transistor $Tr_2$. The diodes $D_{31}$ and $D_{32}$ may be constituted by the collector and the base of a diode-connected transistor.

The collector of the bias-current supplying transistor $Tr_2$ is connected to a bias power supply potential $V_{BAT}$. The emitter of the bias-current supplying transistor $Tr_2$ is connected to one end of the impedance circuit 4.

A bias control current $I_{cont}$ is supplied from the current source 31 to the base of the bias-current supplying transistor $Tr_2$.

The bias-current supplying transistor $Tr_2$ operates as an emitter follower circuit. A DC bias current $I_{bias}$ corresponding to the bias control current $I_{cont}$ is supplied from the emitter of the bias-current supplying transistor $Tr_2$ to the base of the amplifying transistor $Tr_1$ via the impedance circuit 4. The impedance circuit 4 includes at least two elements connected to each other, such as a resistor, an inductor, and a capacitor constituted by lumped elements.

The impedance circuit 4 is disposed between node A on a transmit path for an RF signal between the coupling capacitor $C_1$ and the base of the amplifying transistor $Tr_1$ and node B on a supply path for the bias current $I_{bias}$. More specifically, the impedance circuit 4 is connected between the base of the amplifying transistor $Tr_1$ into which the input signal $RF_{IN}$ is input (which is the signal input terminal of the amplifying transistor $Tr_1$) and the emitter of the bias-current supplying transistor $Tr_2$ from which the bias current $I_{bias}$ is output (which is the bias-current output terminal of the bias circuit 3).

Figure 2:
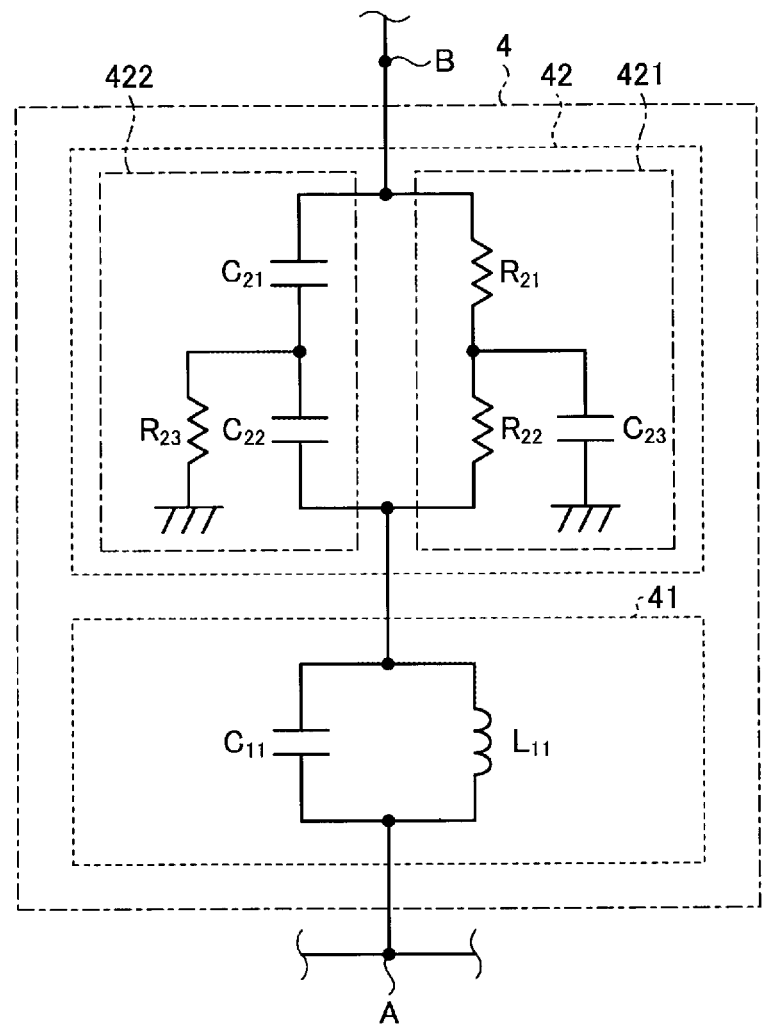
FIG. 2 is a circuit diagram illustrating the configuration of an impedance circuit between the power amplifier and bias circuit according to the first embodiment.

FIG. 2 is a circuit diagram illustrating the configuration of the impedance circuit 4 of the power amplifier circuit 1 according to the first embodiment.

As shown in FIGS. 1 and 2, in the first embodiment, the impedance circuit 4 includes first and second impedance circuits 41 and 42.

The first impedance circuit 41 is connected to the base of the amplifying transistor $Tr_1$, which is the signal input terminal of the amplifying transistor $Tr_1$. The first impedance circuit 41 has frequency characteristics in which the attenuation becomes maximized within the transmit frequency band.

The second impedance circuit 42 is connected between the first impedance circuit 41 and the emitter of the bias-current supplying transistor $Tr_2$, which is the bias-current output terminal of the bias circuit 3. The second impedance circuit 42 has frequency characteristics in which the attenuation becomes maximized within the transmit frequency band.

The first and second impedance circuits 41 and 42 in the first embodiment will be discussed below in detail.

The first impedance circuit 41 includes an inductor $L_{11}$, which is an inductive element, and a capacitor $C_{11}$, which is a capacitive element.

The inductor $L_{11}$ and the capacitor $C_{11}$ are connected in parallel with each other on the supply path for the bias current $I_{bias}$ so as to form an LC parallel resonance circuit. In the first embodiment, the resonant frequency of the LC parallel resonance circuit forming the first impedance circuit 41 is set to be within the transmit frequency band. This allows the first impedance circuit 41 to exhibit the frequency characteristics in which the attenuation becomes maximized within the transmit frequency band.

The second impedance circuit 42 includes three resistors $R_{21}$, $R_{22}$, and $R_{23}$, which are resistive elements, and three capacitors $C_{21}$, $C_{22}$, and $C_{23}$, which are capacitive elements.

The two resistors $R_{21}$ and $R_{22}$ are connected in series with each other on the supply path for the bias current $I_{bias}$.

The two capacitors $C_{21}$ and $C_{22}$ are connected in series with each other. The series circuit of the capacitors $C_{21}$ and $C_{22}$ is connected between the two ends of the series circuit of the resistors $R_{21}$ and $R_{22}$.

The capacitor $C_{23}$ is connected between a reference potential and a node between the two resistors $R_{21}$ and $R_{22}$.

The resistor $R_{23}$ is connected between a reference potential and a node between the two capacitors $C_{21}$ and $C_{22}$.

The two resistors $R_{21}$ and $R_{22}$ and the capacitor $C_{23}$ form a first T circuit 421. The two capacitors $C_{21}$ and $C_{22}$ and the resistor $R_{23}$ form a second T circuit 422.

The first and second T circuits 421 and 422 form a notch filter circuit. In the first embodiment, the center frequency of the notch filter circuit forming the second impedance circuit 42 is set within the transmit frequency band. This allows the second impedance circuit 42 to exhibit the frequency characteristics in which the attenuation becomes maximized within the transmit frequency band.

In the first embodiment, the first impedance circuit 41 is an LC parallel resonance circuit, while the second impedance circuit 42 is a notch filter circuit. However, the first impedance circuit 41 may be a notch filter circuit, while the second impedance circuit 42 may be an LC parallel resonance circuit.

In the power amplifier circuit 1 according to the first embodiment, as shown in FIG. 1, at least the amplifier 2, the bias circuit 3, and the impedance circuit 4 (first and second impedance circuits 41 and 42) are mounted on a single semiconductor chip 100, thereby reducing the size and/or the cost of the power amplifier circuit 1.

Figure 3:
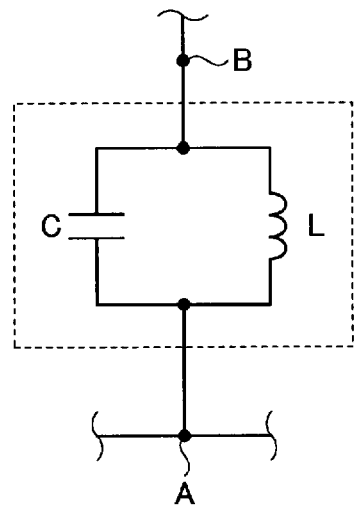
FIG. 3 is a circuit diagram illustrating the configuration of an impedance circuit between a power amplifier and bias circuit according to a comparative example.

FIG. 3 is a circuit diagram illustrating the configuration of an impedance circuit of a power amplifier circuit according to a comparative example.

The impedance circuit of the comparative example in FIG. 3 is an LC parallel resonance circuit including an inductor L, which is an inductive element, and a capacitor C, which is a capacitive element, connected with parallel with each other on the supply path for the bias current $I_{bias}$. This LC parallel resonance circuit is equivalent to the first impedance circuit 41 (LC parallel resonance circuit) in the first embodiment in FIG. 2. In other words, unlike the impedance circuit 4 in the first embodiment in FIG. 2, the impedance circuit of the comparative example in FIG. 3 does not have the second impedance circuit 42 (notch filter circuit).

Figure 4:
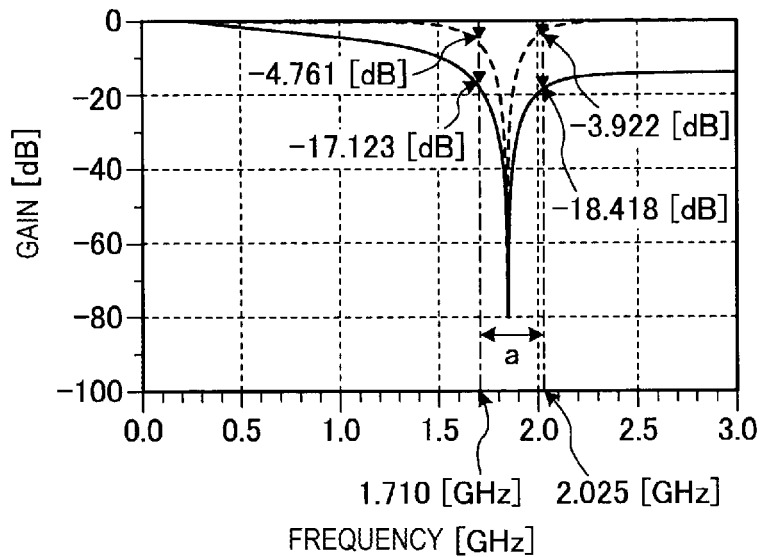
FIG. 4 is a graph illustrating an example of the simulation results of bandpass characteristics of the impedance circuit between a power amplifier and bias circuit according to the first embodiment.
Figure 5:
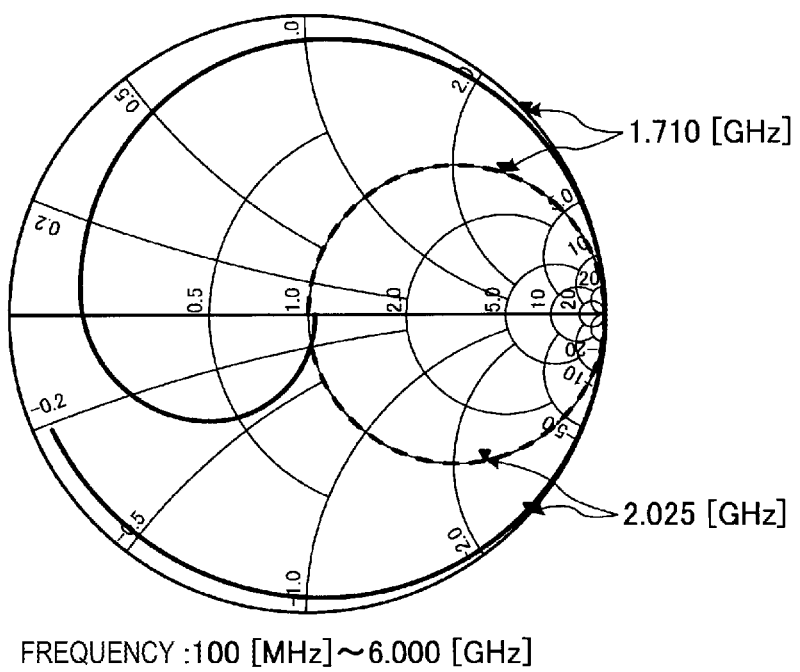
FIG. 5 is a Smith chart illustrating an example of the simulation results of load characteristics of the impedance circuit according to the first embodiment.

FIG. 4 is a graph illustrating an example of the simulation results of bandpass characteristics of the impedance circuit 4 according to the first embodiment. FIG. 5 is a Smith chart illustrating an example of the simulation results of load characteristics of the impedance circuit 4 according to the first embodiment.

In the graph in FIG. 4, the horizontal axis represents the frequency, and the vertical axis represents the gain. The solid line in FIG. 4 indicates the bandpass characteristics on the path from node A to node B obtained in the configuration of the first embodiment shown in FIG. 2. The broken line in FIG. 4 indicates the bandpass characteristics on the path from node A to node B obtained in the configuration of the comparative example shown in FIG. 3.

The solid line in FIG. 5 indicates the load characteristics of the impedance circuit 4 of the first embodiment plotted in a frequency range of about 100.0 MHz to 6.000 GHz. The broken line in FIG. 5 indicates load characteristics of the comparative example plotted in a frequency range of about 100.0 MHz to 6.000 GHz.

FIGS. 4 and 5 show the simulation results when the frequency range having a bandwidth a from about 1.710 to 2.025 GHz is used as the transmit frequency band to be amplified by the power amplifier circuit 1. The transmit frequency band to be amplified by the power amplifier circuit 1 is not limited to this frequency range. A suitable frequency range including one or multiple bands is set according to the communication method of a mobile communication terminal device using the power amplifier circuit 1.

FIGS. 4 and 5 also show the simulation results when the resonant frequency of the LC parallel resonance circuit forming the first impedance circuit 41, the center frequency of the notch filter circuit forming the second impedance circuit 42, and the resonant frequency of the LC parallel resonance circuit of the comparative example coincide with each other within the transmit frequency band.

FIG. 4 shows that, in the configuration of the comparative example in FIG. 3, the gain at 1.710 GHz is about −4.761 dB and the gain at 2.025 GHz is about −3.922 dB. FIG. 4 also shows that, in the configuration of the impedance circuit 4 of the first embodiment in FIG. 2, the gain at 1.710 GHz is about −17.123 dB and the gain at 2.025 GHz is about −18.418 dB. That is, the configuration of the impedance circuit 4 achieves a greater amount of attenuation in the transmit frequency band on the supply path for the bias current $I_{bias}$ than the configuration of the comparative example.

As described above, in the first embodiment, the gain in the band of about 1.710 to 2.025 GHz is −10 dB or lower, thereby achieving higher attenuation characteristics than in the comparative example. As a result, the signal level of the input signal $RF_{IN}$ which leaks to the bias circuit 3 before being input into the base of the amplifying transistor $Tr_1$ can be reduced to be about 1/10 or smaller in terms of the power ratio. The attenuation within the transmit frequency band achieved by the impedance circuit 4 (composite circuit of the first and second impedance circuits 41 and 42) can be about 10 dB or greater.

As shown in FIG. 5, both at 1.710 GHz and 2.025 GHz, the impedance circuit 4 of the first embodiment achieves higher impedance on the supply path for the bias current $I_{bias}$ than the comparative example.

As shown in FIG. 5, even in a frequency band lower than 1.710 GHz and a frequency band higher than 2.025 GHz, the impedance circuit 4 of the first embodiment achieves higher impedance on the supply path for the bias current $I_{bias}$ than the comparative example.

As discussed above, in the first embodiment, the first impedance circuit 41 constituted by an LC parallel resonance circuit and the second impedance circuit 42 constituted by a notch filter circuit are disposed on the supply path for the bias current $I_{bias}$. With this configuration, the impedance of the supply path for the bias current $I_{bias}$ seen from the transmit path of RF signals becomes high over a wide frequency range. The power amplifier circuit 1 is thus able to efficiently amplify RF signals over a wide frequency band.

Second Embodiment

Figure 6:
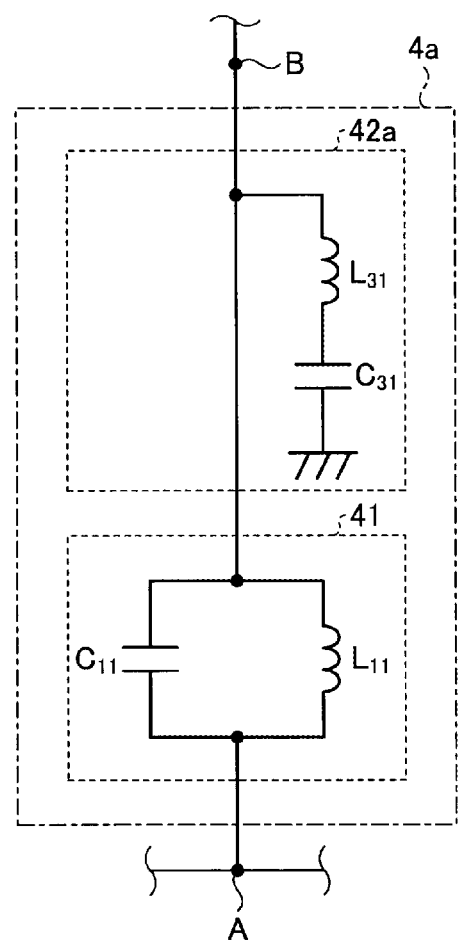
FIG. 6 is a circuit diagram illustrating the configuration of an impedance circuit of a power amplifier circuit according to a second embodiment.

FIG. 6 is a circuit diagram illustrating the configuration of an impedance circuit 4a of a power amplifier circuit according to a second embodiment. The same elements as those of the first embodiment are designated by like reference numerals, and an explanation thereof will be omitted.

The impedance circuit 4a of the second embodiment is different from the impedance circuit 4 of the first embodiment in the configuration of a second impedance circuit 42a.

As shown in FIG. 6, the impedance circuit 4a includes the first impedance circuit 41 and the second impedance circuit 42a.

The second impedance circuit 42a is connected between the first impedance circuit 41 and the emitter of the bias-current supplying transistor $Tr_2$, which is the bias-current output terminal of the bias circuit 3. The second impedance circuit 42a has frequency characteristics in which the attenuation becomes maximized within the transmit frequency band.

The second impedance circuit 42a in the second embodiment will be discussed below in detail.

The second impedance circuit 42a includes an inductor $L_{31}$, which is an inductive element, and a capacitor $C_{31}$, which is a capacitive element.

The inductor $L_{31}$ and the capacitor $C_{31}$ are connected in series with each other between a reference potential and the supply path for the bias current $I_{bias}$ so as to form an LC series resonance circuit. In the example in FIG. 6, the LC series resonance circuit is connected in series between the reference potential and node B on the supply path for the bias current $I_{bias}$, that is, the bias-current output terminal of the bias circuit 3. The LC series resonance circuit may be connected in series between a reference potential and node A on the transmit path for RF signals, that is, the signal input terminal of the amplifying transistor $Tr_1$.

In the second embodiment, the first impedance circuit 41 is an LC parallel resonance circuit, while the second impedance circuit 42a is an LC series resonance circuit. However, the first impedance circuit 41 may be an LC series resonance circuit, while the second impedance circuit 42a may be an LC parallel resonance circuit.

Figure 7:
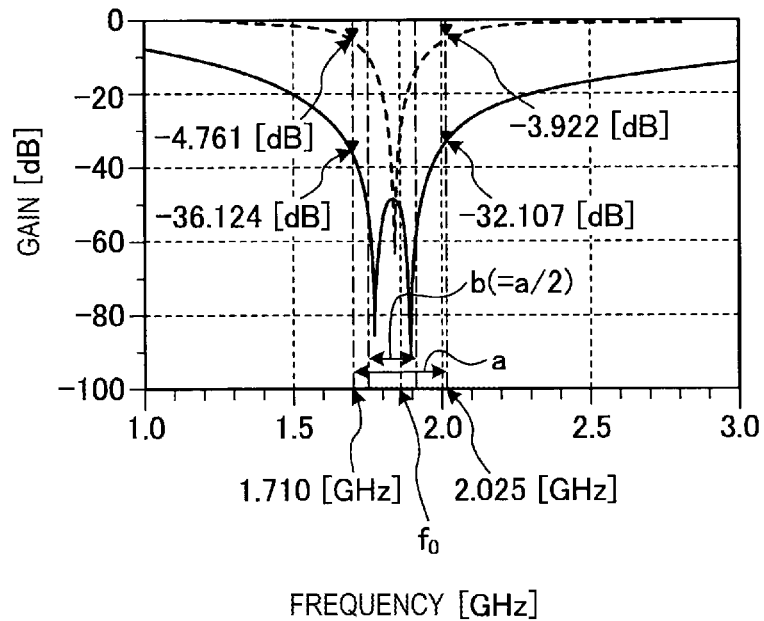
FIG. 7 is a graph illustrating an example of the simulation results of bandpass characteristics of the impedance circuit according to the second embodiment.
Figure 8:
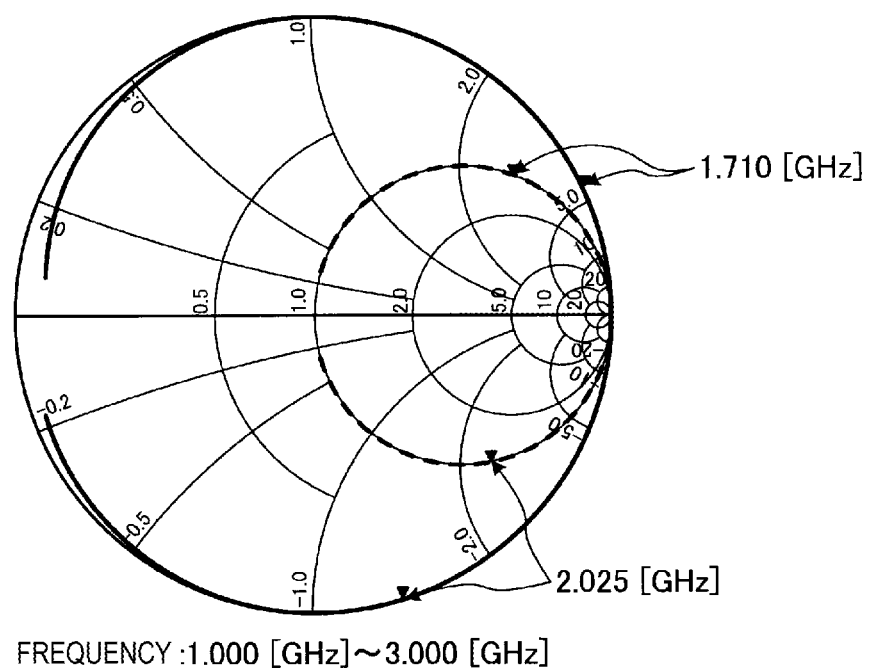
FIG. 8 is a Smith chart illustrating an example of the simulation results of load characteristics of the impedance circuit according to the second embodiment.

FIG. 7 is a graph illustrating an example of the simulation results of bandpass characteristics of the impedance circuit 4a according to the second embodiment. FIG. 8 is a Smith chart illustrating an example of the simulation results of load characteristics of the impedance circuit 4a according to the second embodiment.

In the graph in FIG. 7, the horizontal axis represents the frequency, and the vertical axis represents the gain. The solid line in FIG. 7 indicates the bandpass characteristics on the path from node A to node B obtained in the configuration of the second embodiment shown in FIG. 6. The broken line in FIG. 7 indicates the bandpass characteristics on the path from node A to node B obtained in the configuration of the comparative example shown in FIG. 3.

The solid line in FIG. 8 indicates the load characteristics of the impedance circuit 4a of the second embodiment plotted in a frequency range of about 1.000 to 3.000 GHz. The broken line in FIG. 8 indicates load characteristics of the comparative example plotted in a frequency range of about 1.000 to 3.000 GHz.

As in the first embodiment, FIGS. 7 and 8 show the simulation results when the frequency range having a bandwidth a from about 1.710 to 2.025 GHz is used as the transmit frequency band to be amplified by the power amplifier circuit of the second embodiment.

FIGS. 7 and 8 also show the simulation results when the resonant frequency of the LC parallel resonance circuit forming the first impedance circuit 41 and that of the LC series resonance circuit forming the second impedance circuit 42a are different from each other within the transmit frequency band.

More specifically, FIGS. 7 and 8 show the simulation results when one of the resonant frequency of the LC parallel resonance circuit and that of the LC series resonance circuit is set to be a frequency lower than the center frequency $f_0$ of the transmit frequency band and when the other one of the resonant frequency of the LC parallel resonance circuit and that of the LC series resonance circuit is set to be a frequency higher than the center frequency $f_0$ of the transmit frequency band.

The flexibility concerning the circuit layout of the LC parallel resonance circuit is lower than that of the LC series resonance circuit. The inductor $L_{11}$ forming the LC parallel resonance circuit is disposed on the supply path for the bias current $I_{bias}$, and the bias current $I_{bias}$ is thus attenuated due to resistance components of the inductor $L_{11}$. The resonant frequency of the LC parallel resonance circuit can be higher than that of the LC series resonance circuit. More specifically, the resonant frequency of the LC series resonance circuit is set to be a frequency lower than the center frequency $f_0$ of the transmit frequency band, while the resonant frequency of the LC parallel resonance circuit is set to be a frequency higher than the center frequency $f_0$ of the transmit frequency band. This increases the flexibility concerning the circuit layout of the LC parallel resonance circuit. Setting of a high resonant frequency of the LC parallel resonance circuit can set a small inductance value of the inductor $L_{11}$, thereby reducing resistance components of the inductor $L_{11}$. It is thus possible to decrease the loss of the bias current $I_{bias}$ caused by the DC resistance. Conversely, the resonant frequency of the LC parallel resonance circuit may be set to be a frequency lower than the center frequency $f_0$ of the transmit frequency band, while the resonant frequency of the LC series resonance circuit may be set to be a frequency higher than the center frequency $f_0$ of the transmit frequency band.

If the difference between the resonant frequency of the LC parallel resonance circuit and that of the LC series resonance circuit is large, the attenuation may be decreased in a band between the two resonant frequencies. In the examples in FIGS. 7 and 8, the two resonant frequencies are set within a frequency band having a bandwidth b which is about ½ or smaller than the bandwidth a of the transmit frequency band. This makes it less likely to decrease the attenuation at and near the center frequency $f_0$ of the transmit frequency band.

FIG. 7 shows that, in the configuration of the impedance circuit 4a of the second embodiment in FIG. 6, the gain at 1.710 GHz is about −36.124 dB and the gain at 2.025 GHz is about −32.107 dB. That is, the configuration of the impedance circuit 4a of the second embodiment achieves a greater amount of attenuation in the transmit frequency band on the supply path for the bias current $I_{bias}$ than the configuration of the impedance circuit 4 of the first embodiment.

As described above, in the second embodiment, as well as in the first embodiment, the gain in the band of about 1.710 to 2.025 GHz is −10 dB or lower, thereby achieving higher attenuation characteristics than in the comparative example. As a result, the signal level of the input signal $RF_{IN}$ which leaks to the bias circuit 3 before being input into the base of the amplifying transistor $Tr_1$ can be reduced to be about 1/10 or smaller in terms of the power ratio. The attenuation within the transmit frequency band achieved by the impedance circuit 4a (composite circuit of the first and second impedance circuits 41 and 42a) can be about 10 dB or greater.

As shown in FIGS. 7 and 8, the impedance circuit 4a of the second embodiment achieves high impedance on the supply path for the bias current $I_{bias}$ over a wider frequency band than the impedance circuit 4 of the first embodiment.

As discussed above, in the second embodiment, the first impedance circuit 41 constituted by an LC parallel resonance circuit and the second impedance circuit 42a constituted by an LC series resonance circuit are disposed on the supply path for the bias current $I_{bias}$. With this configuration, the impedance of the supply path for the bias current $I_{bias}$ seen from the transmit path of RF signals becomes high over a wider frequency range than in the first embodiment. The power amplifier circuit of the second embodiment is thus able to efficiently amplify RF signals over a wider frequency range than that of the first embodiment.

Fewer elements are required for the configuration of the impedance circuit 4a of the second embodiment than those for the configuration of the impedance circuit 4 of the first embodiment. The size of the power amplifier circuit of the second embodiment may thus be decreased to be smaller than that of the first embodiment, and the cost thereof may also be reduced. In the second embodiment, the size of the single semiconductor chip 100 (see FIG. 1) for mounting the amplifier 2 and the bias circuit 3 thereon may also be decreased to be smaller than that of the first embodiment, and the cost thereof may also be reduced.

Third Embodiment

Figure 9:
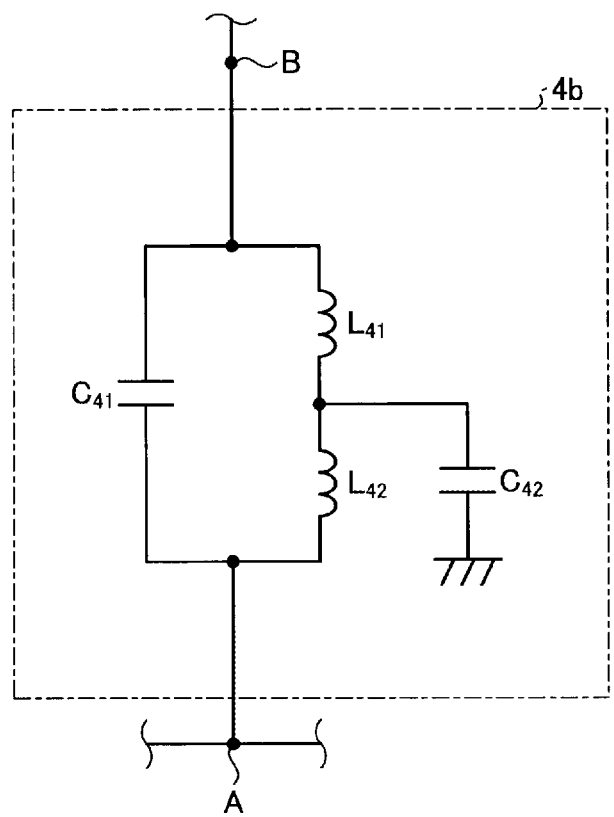
FIG. 9 is a circuit diagram illustrating the configuration of an impedance circuit of a power amplifier circuit according to a third embodiment.

FIG. 9 is a circuit diagram illustrating the configuration of an impedance circuit 4b of a power amplifier circuit according to a third embodiment. The same elements as those of the first embodiment are designated by like reference numerals, and an explanation thereof will be omitted.

The configuration of the impedance circuit 4b of the third embodiment is different from that of the impedance circuit 4 of the first embodiment.

In the third embodiment, the impedance circuit 4b is connected between the base of the amplifying transistor $Tr_1$, which is the signal input terminal of the amplifying transistor $Tr_1$, and the emitter of the bias-current supplying transistor $Tr_2$, which is the bias-current output terminal of the bias circuit 3.

The impedance circuit 4b of the third embodiment will be discussed below in detail.

As shown in FIG. 9, the impedance circuit 4b includes an inductor $L_{41}$, which is a first inductive element, an inductor $L_{42}$, which is a second inductive element, a capacitor $C_{41}$, which is a first capacitive element, and a capacitor $C_{42}$, which is a second capacitive element.

The inductors $L_{41}$ and $L_{42}$ are connected in series with each other between the base of the amplifying transistor $Tr_1$, which is the signal input terminal of the amplifying transistor $Tr_1$, and the emitter of the bias-current supplying transistor $Tr_2$, which is the bias-current output terminal of the bias circuit 3.

The capacitor $C_{41}$ is connected between the two ends of the series circuit constituted by the inductors $L_{41}$ and $L_{42}$.

The capacitor $C_{42}$ is connected between a reference potential and a node between the inductors $L_4$ and $L_{42}$.

In the above-described configuration, the inductors $L_{41}$ and $L_{42}$ and the capacitor $C_{41}$ form an LC parallel resonance circuit. The inductors $L_{41}$ and $L_{42}$ and the capacitor $C_{42}$ form an LC low-pass filter circuit.

Figure 10:
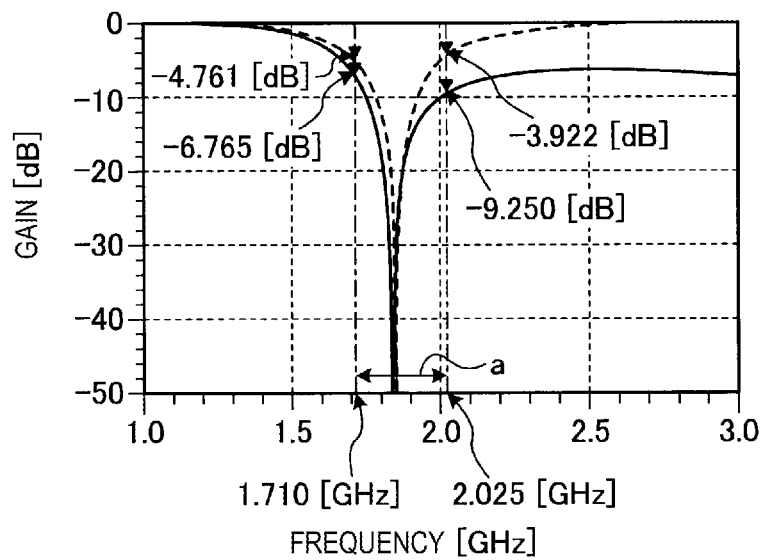
FIG. 10 is a graph illustrating an example of the simulation results of bandpass characteristics of the impedance circuit according to the third embodiment.
Figure 11:
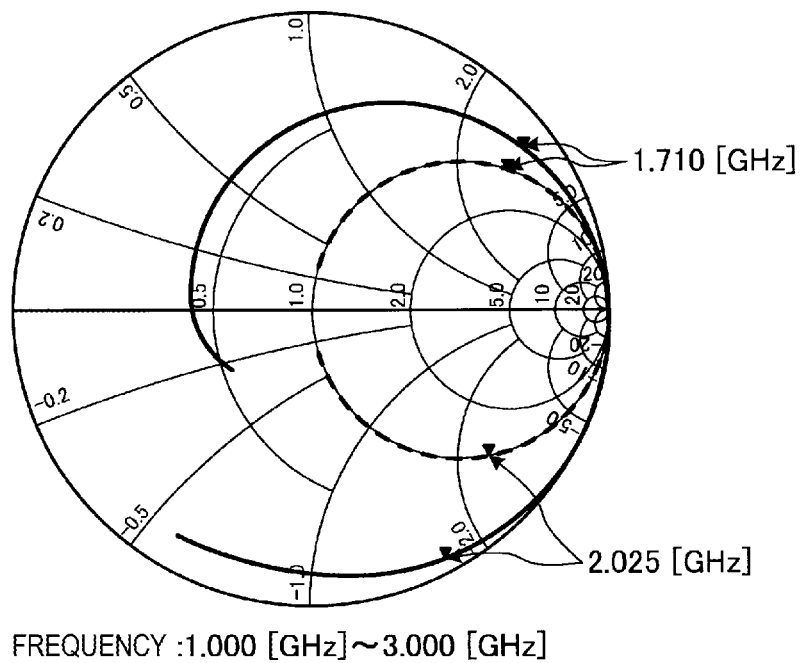
FIG. 11 is a Smith chart illustrating an example of the simulation results of load characteristics of the impedance circuit according to the third embodiment.

FIG. 10 is a graph illustrating an example of the simulation results of bandpass characteristics of the impedance circuit 4b according to the third embodiment. FIG. 11 is a Smith chart illustrating an example of the simulation results of load characteristics of the impedance circuit 4b according to the third embodiment.

In the graph in FIG. 10, the horizontal axis represents the frequency, and the vertical axis represents the gain. The solid line in FIG. 10 indicates the bandpass characteristics on the path from node A to node B obtained in the configuration of the third embodiment shown in FIG. 9. The broken line in FIG. 10 indicates the bandpass characteristics on the path from node A to node B obtained in the configuration of the comparative example shown in FIG. 3.

The solid line in FIG. 11 indicates the load characteristics of the impedance circuit 4b of the third embodiment plotted in a frequency range of about 1.000 to 3.000 GHz. The broken line in FIG. 11 indicates load characteristics of the comparative example plotted in a frequency range of about 1.000 to 3.000 GHz.

As in the first embodiment, FIGS. 10 and 11 show the simulation results when the frequency range having a bandwidth a from about 1.710 to 2.025 GHz is used as the transmit frequency band to be amplified by the power amplifier circuit of the third embodiment.

FIGS. 10 and 11 also show the simulation results when the resonant frequency of the LC parallel resonance circuit in the third embodiment and that of the LC parallel resonance circuit in the comparative example coincide with each other within the transmit frequency band and when the cutoff frequency of the LC low-pass filter circuit in the third embodiment is set within a frequency band lower than the lower frequency edge of the transmit frequency band (1.710 GHz in the example in FIG. 10).

FIG. 10 shows that, in the configuration of the impedance circuit 4b of the third embodiment in FIG. 9, the gain at 1.710 GHz is about −6.765 dB and the gain at 2.025 GHz is about −9.250 dB. That is, the configuration of the impedance circuit 4b of the third embodiment achieves a greater amount of attenuation in the transmit frequency band on the supply path for the bias current $I_{bias}$ than the configuration of the comparative example.

In the third embodiment, because of the attenuation characteristics of the LC low-pass filter circuit, the attenuation in a frequency range higher than the resonant frequency of the LC parallel resonance circuit can be increased. This makes it possible to extend the bandwidth of the transmit frequency band to the higher frequency side.

FIG. 11 shows that, as in the first embodiment, both at 1.710 GHz and 2.025 GHz, the configuration of the impedance circuit 4b of the third embodiment achieves higher impedance on the supply path for the bias current $I_{bias}$ than the configuration of the comparative example.

FIG. 11 also shows that, particularly in a frequency band higher than 2.025 GHz, the configuration of the impedance circuit 4b of the third embodiment achieves higher impedance on the supply path for the bias current $I_{bias}$ than the configuration of the comparative example.

As discussed above, in the third embodiment, the impedance circuit 4b including an LC parallel resonance circuit and an LC low-pass filter circuit are disposed on the supply path for the bias current $I_{bias}$. With this configuration, the impedance of the supply path for the bias current $I_{bias}$ seen from the transmit path of RF signals becomes high over a wide frequency range. The power amplifier circuit of the third embodiment is thus able to efficiently amplify RF signals over a wide frequency range.

As in the impedance circuit 4a of the second embodiment, fewer elements are required for the configuration of the impedance circuit 4b of the third embodiment than those for the configuration of the impedance circuit 4 of the first embodiment. The size of the power amplifier circuit of the third embodiment may thus be decreased to be smaller than that of the first embodiment, and the cost thereof may also be reduced. In the third embodiment, the size of the single semiconductor chip 100 (see FIG. 1) for mounting the amplifier 2 and the bias circuit 3 thereon may also be reduced to be smaller than that of the first embodiment, and the cost thereof may also be reduced.

Fourth Embodiment

Figure 12:
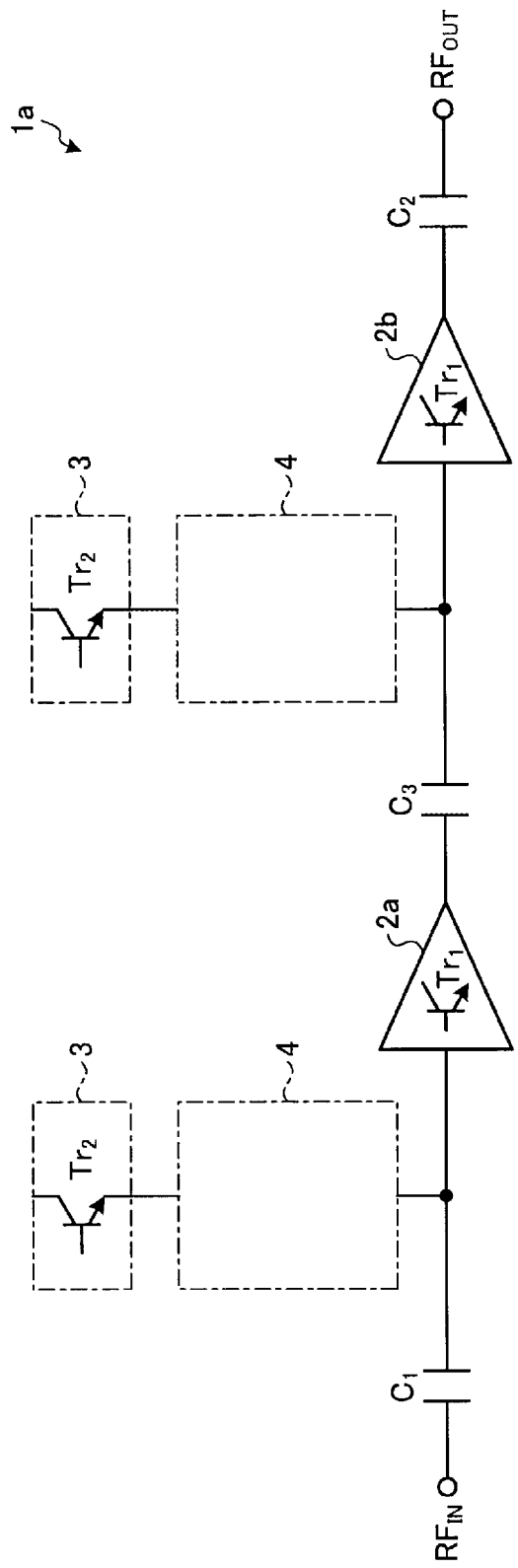
FIG. 12 is a circuit diagram illustrating the configuration of a power amplifier circuit according to a fourth embodiment.

FIG. 12 is a circuit diagram illustrating the configuration of a power amplifier circuit 1a according to a fourth embodiment. The same elements as those of the first embodiment are designated by like reference numerals, and an explanation thereof will be omitted.

The power amplifier circuit 1a of the fourth embodiment differs from the power amplifier circuit 1 of the first embodiment in that two stages of amplifiers 2a and 2b are provided.

In the power amplifier circuit 1a, a coupling capacitor $C_3$ is disposed between the first and second stages of amplifiers 2a and 2b. The coupling capacitor $C_3$ blocks DC components at least between the amplifiers 2a and 2b.

The configuration of each of the amplifiers 2a and 2b may be the same as that of the amplifier 2 in the first through third embodiments or may be different from that of the amplifier 2.

In the fourth embodiment, two stages of amplifiers 2a and 2b are provided, thereby achieving higher output than in the first through third embodiments.

The amplifier 2a may be used as a drive-stage amplifier, while the amplifier 2b may be used as a power-stage amplifier. Different levels of gain may be set for the amplifiers 2a and 2b, or one of the amplifiers 2a and 2b may be used as a variable gain amplifier. The versatility is thus enhanced.

Instead of two stages of amplifiers 2a and 2b, three or more stages of amplifiers may be provided. In this case, multiple amplifiers are connected by using a coupling capacitor $C_3$, thereby achieving higher output than in the use of two amplifiers 2a and 2b in FIG. 12.

In the fourth embodiment, two stages of amplifiers 2a and 2b are provided in the configuration of the first embodiment, that is, in the configuration in which the impedance circuit 4 is provided. However, multiple stages of amplifiers may be provided in the configuration of the second embodiment in which the impedance circuit 4a is provided or in that of the third embodiment in which the impedance circuit 4b is provided.

In the first through fourth embodiments, a coupling capacitor is provided between the preceding circuit and the power amplifier circuit and between the power amplifier circuit and the subsequent circuit. In the fourth embodiment, a coupling capacitor is also provided between the amplifiers. Alternatively, an input matching circuit may be provided between the preceding circuit and the power amplifier circuit, while an output matching circuit may be provided between the power amplifier circuit and the subsequent circuit, and an interstage matching circuit may be disposed between the amplifiers.

In the second embodiment, the resonant frequency of the LC parallel resonance circuit (first impedance circuit) and that of the LC series resonance circuit (second impedance circuit) are made different from each other. Likewise, in the first embodiment, the center frequency of the notch filter circuit (second impedance circuit) and the resonant frequency of the LC parallel resonance circuit (first impedance circuit) may be made different from each other. This achieves high impedance on the supply path for the bias current $I_{bias}$ over a wider frequency range, as in the second embodiment.

In the second embodiment, the resonant frequency of the LC parallel resonance circuit (first impedance circuit) and that of the LC series resonance circuit (second impedance circuit) are set within a frequency band having a bandwidth which is about ½ or smaller than the bandwidth of the transmit frequency band. Likewise, in the first embodiment, the resonant frequency of the LC parallel resonance circuit (first impedance circuit) and the center frequency of the notch filter circuit (second impedance circuit) may be set within a frequency band having a bandwidth which is about ½ or smaller than the bandwidth of the transmit frequency band. This makes it less likely to decrease the attenuation at and near the center frequency $f_0$ of the transmit frequency band, as in the second embodiment.

As discussed in the first and second embodiments, the circuit configuration of the first impedance circuit and that of the second impedance circuit can be different from each other. The flexibility concerning the circuit layout of an LC parallel resonance circuit is low, as stated above. The inductor forming the LC parallel resonance circuit is disposed on the supply path for a bias current, and the bias current is thus attenuated due to resistance components of the inductor. This increases the loss of the bias current due to the DC resistance. Consequently, in terms of the flexibility concerning the circuit layout and an increase in the loss due to the DC resistance, it may not form both of the first and second impedance circuits by LC parallel resonance circuits.

In the first and second embodiments, an LC parallel resonance circuit is used as the first impedance circuit, and a notch filter circuit or an LC series resonance circuit is used as the second impedance circuit. However, the first and second impedance circuits are not limited to these types of circuits. In the third embodiment, the impedance circuit is constituted by an LC parallel resonance circuit and an LC low-pass filter circuit. However, the impedance circuit is not restricted to this type of circuit. The first and second impedance circuits and the impedance circuit may be filter circuits different from those discussed above.

The above-described embodiments are provided for facilitating the understanding of the disclosure but are not intended to be exhaustive or to limit the disclosure to the precise forms disclosed. Modifications and/or improvements may be made without departing from the scope and spirit of the disclosure, and equivalents of the embodiments are also encompassed in the disclosure.

The disclosure may be configured in the following manner as discussed above or in place of the above-described configurations.

(1) According to one aspect of the disclosure, there is provided a power amplifier circuit for amplifying a radio-frequency signal in a transmit frequency band. The power amplifier circuit includes an amplifier, a bias circuit, and an impedance circuit. The amplifier amplifies power of a radio-frequency signal and outputs an amplified signal. The impedance circuit is connected between a signal input terminal of the amplifier and a bias-current output terminal of the bias circuit and has frequency characteristics in which attenuation is obtained in the transmit frequency band. The impedance circuit includes first and second impedance circuits. The first impedance circuit is connected to the signal input terminal. The second impedance circuit is connected between the first impedance circuit and the bias-current output terminal.

With this configuration, the provision of both of the first and second impedance circuits makes it possible to increase the impedance in the transmit frequency band on a path between the signal input terminal of the amplifier and the bias-current output terminal of the bias circuit, that is, the supply path for a bias current. The power amplifier circuit thus achieves a greater amount of attenuation in the transmit frequency band on the supply path for the bias current and also implements higher impedance on the supply path for the bias current over a wide frequency range. The power amplifier circuit is thus able to efficiently amplify RF signals over a wide frequency band.

(2) In the power amplifier circuit according to (1), the attenuation in the transmit frequency band obtained by the impedance circuit may be about 10 dB or greater.

The impedance circuit is thus able to achieve the attenuation of about 10 dB or greater in the transmit frequency band.

(3) In the power amplifier circuit according to (1) or (2), one of the first and second impedance circuits may be an LC parallel resonance circuit. The LC parallel resonance circuit includes an inductive element and a capacitive element disposed in parallel with each other between the signal input terminal and the bias-current output terminal.

The use of the LC parallel resonance circuit makes it possible to achieve high impedance in the transmit frequency band on the supply path for the bias current.

(4) In the power amplifier circuit according to (3), the resonant frequency of the LC parallel resonance circuit may be set within the transmit frequency band.

With this configuration, the LC parallel resonance circuit achieves a greater amount of attenuation in the transmit frequency band on the supply path for the bias current.

(5) In the power amplifier circuit according to (3) or (4), the other one of the first and second impedance circuits may be a notch filter circuit. The notch filter circuit includes first and second T circuits disposed in parallel with each other between the signal input terminal and the bias-current output terminal. The first T circuit may include two resistive elements disposed in series with each other between the signal input terminal and the bias-current output terminal and a capacitive element connected between a reference potential and a node between the two resistive elements. The second T circuit may include two capacitive elements connected in series with each other between two terminals of a series circuit constituted by the two resistive elements and a resistive element connected between a reference potential and a node between the two capacitive elements.

The use of the notch filter circuit makes it possible to achieve high impedance in the transmit frequency band on the supply path for the bias current.

(6) In the power amplifier circuit according to (5), the center frequency of the notch filter circuit may be set within the transmit frequency band.

With this configuration, the notch filter circuit achieves a greater amount of attenuation in the transmit frequency band on the supply path for the bias current.

(7) In the power amplifier circuit according to (6), the resonant frequency of the LC parallel resonance circuit and the center frequency of the notch filter circuit may be different from each other. One of the resonant frequency and the center frequency may be set to be a frequency within the transmit frequency band which is lower than a center frequency of the transmit frequency band. The other one of the resonant frequency and the center frequency may be set to be a frequency within the transmit frequency band which is higher than the center frequency of the transmit frequency band.

This configuration makes it possible to increase the attenuation in the transmit frequency band on the supply path for the bias current and also to implement high impedance on the supply path for the bias current over a wider frequency range.

(8) In the power amplifier circuit according to (7), the resonant frequency of the LC parallel resonance circuit and the center frequency of the notch filter circuit may be set within a frequency band having a bandwidth which is about ½ or smaller than a bandwidth of the transmit frequency band.

This makes it less likely to decrease the impedance on the supply path for the bias current at and near the center frequency of the transmit frequency band.

(9) In the power amplifier circuit according to (3) or (4), the other one of the first and second impedance circuits may be an LC series resonance circuit. The LC series resonance circuit includes an inductive element and a capacitive element connected in series with each other between the signal input terminal and a reference potential or between the bias-current output terminal and a reference potential.

The use of the LC series resonance circuit makes it possible to achieve high impedance in the transmit frequency band on the supply path for the bias current. The LC series resonance circuit can be formed with fewer elements, thereby reducing the scale of the impedance circuit. This may decrease the size of the power amplifier circuit and may also reduce the cost thereof.

(10) In the power amplifier circuit according to (9), the resonant frequency of the LC parallel resonance circuit and that of the LC series resonance circuit may be different from each other. One of the resonant frequency of the LC parallel resonance circuit and that of the LC series resonance circuit may be set to be a frequency within the transmit frequency band which is lower than a center frequency of the transmit frequency band. The other one of the resonant frequency of the LC parallel resonance circuit and that of the LC series resonance circuit may be set to be a frequency within the transmit frequency band which is higher than the center frequency of the transmit frequency band.

This configuration makes it possible to increase the attenuation in the transmit frequency band on the supply path for the bias current and also to implement high impedance on the supply path for the bias current over a wider frequency range.

(11) In the power amplifier circuit according to (10), the resonant frequency of the LC parallel resonance circuit and that of the LC series resonance circuit may be set within a frequency band having a bandwidth which is about ½ or smaller than a bandwidth of the transmit frequency band.

This makes it less likely to decrease the impedance on the supply path for the bias current at and near the center frequency of the transmit frequency band.

(12) In the power amplifier circuit according to (1) or (2), the circuit configuration of the first impedance circuit and that of the second impedance circuit may be different from each other.

This makes it possible to decrease the areas of the first and second impedance circuits which occupy the power amplifier circuit.

(13) In the power amplifier circuit according to one of (1) to (12), the power amplifier circuit may include a plurality of the amplifiers, a plurality of the bias circuits, a plurality of the first impedance circuits, and a plurality of the second impedance circuits. The plurality of amplifiers may be connected to each other in multiple stages at least via a coupling capacitor.

With this configuration, the power amplifier circuit achieves higher output.

(14) In the power amplifier circuit according to one of (1) to (13), at least the amplifier, the bias circuit, the first impedance circuit, and the second impedance circuit may be formed on a single semiconductor chip.

This may decrease the size of the power amplifier circuit and may also reduce the cost thereof.

(15) According to another aspect of the disclosure, there is provided a power amplifier circuit for amplifying a radio-frequency signal in a transmit frequency band. The power amplifier circuit includes an amplifier, a bias circuit, and an impedance circuit. The amplifier amplifies power of a radio-frequency signal and outputs an amplified signal. The impedance circuit is connected between a signal input terminal of the amplifier and a bias-current output terminal of the bias circuit and has frequency characteristics in which attenuation is obtained in the transmit frequency band. The impedance circuit includes first and second inductive elements and first and second capacitive elements. The first and second inductive elements are connected in series with each other between the signal input terminal and the bias-current output terminal. The first capacitive element is connected between two terminals of a series circuit constituted by the first and second inductive elements. The second capacitive element is connected between a reference potential and a node between the first and second inductive elements. The first and second inductive elements and the first capacitive element form an LC parallel resonance circuit. The first and second inductive elements and the second capacitive element form an LC low-pass filter circuit.

With this configuration, the provision of the LC parallel resonance circuit and the LC low-pass filter circuit makes it possible to increase the impedance in the transmit frequency band on the supply path for a bias current. The LC low-pass filter circuit can increase the attenuation in a frequency range higher than the transmit frequency band. The power amplifier circuit is thus able to efficiently amplify RF signals over a wide frequency band. The impedance circuit can be formed with fewer elements and is thus reduced in circuit scale. This may decrease the size of the power amplifier circuit and may also reduce the cost thereof.

(16) In the power amplifier circuit according to (15), the resonant frequency of the LC parallel resonance circuit may be set within the transmit frequency band. The cutoff frequency of the LC low-pass filter circuit may be set within a frequency band which is lower than a lower frequency edge of the transmit frequency band.

With this configuration, the LC parallel resonance circuit and the LC low-pass filter circuit can further increase the attenuation in the transmit frequency band on the supply path for the bias current.

(17) In the power amplifier circuit according to (15) or (16), the power amplifier circuit may include a plurality of the amplifiers, a plurality of the bias circuits, and a plurality of the impedance circuits. The plurality of amplifiers may be connected to each other in multiple stages at least via a coupling capacitor.

With this configuration, the power amplifier circuit achieves higher output.

(18) In the power amplifier circuit according to one of (15) to (17), at least the amplifier and the bias circuit may be formed on a single semiconductor chip.

This may decrease the size of the power amplifier circuit and may also reduce the cost thereof.

According to the aspects of the disclosure, it is possible to efficiently amplify RF signals over a wide frequency band.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
 a plurality of amplifiers collectively configured to amplify a power of a radio-frequency signal in a transmit frequency band, and to output an amplified signal;
 a plurality of bias circuits; and
 a plurality of impedance circuits, each one of the plurality of impedance circuits being connected between a signal input terminal of a respective one of the amplifiers and a bias-current output terminal of a respective one of the bias circuits, each of the plurality of impedance circuits being configured to attenuate signals having frequencies in the transmit frequency band,
 wherein each of the impedance circuits comprises:
  a first impedance circuit connected to the respective signal input terminal, and
  a second impedance circuit connected between the first impedance circuit and the respective bias-current output terminal, and
 wherein the plurality of amplifiers are connected to each other in multiple stages via at least one coupling capacitor.

2. The power amplifier circuit according to claim 1, wherein the attenuation obtained by at least one of the impedance circuits is equal to or greater than 10 dB.

3. The power amplifier circuit according to claim 1, wherein, in at least one of the impedance circuits, the first or second impedance circuit is an LC parallel resonance circuit comprising an inductive element and a capacitive element disposed in parallel with each other between the signal input terminal and the bias-current output terminal.

4. The power amplifier circuit according to claim 3, wherein a resonant frequency of the LC parallel resonance circuit is within the transmit frequency band.

5. The power amplifier circuit according to claim 3, wherein:
 in the at least one of the impedance circuits, the other of the first or second impedance circuit is a notch filter circuit comprising first and second T circuits disposed in parallel with each other between the signal input terminal and the bias-current output terminal,
 the first T circuit comprises:
  two resistive elements disposed in series with each other between the signal input terminal and the bias-current output terminal, and
  a capacitive element connected between a reference potential and a node between the two resistive elements, and
 the second T circuit comprises:
  two capacitive elements connected in series with each other and in parallel with the two resistive elements, and
  a resistive element connected between the reference potential and a node between the two capacitive elements.

6. The power amplifier circuit according to claim 5, wherein a center frequency of the notch filter circuit is within the transmit frequency band.

7. The power amplifier circuit according to claim 6, wherein:
 a resonant frequency of the LC parallel resonance circuit is different than the center frequency of the notch filter circuit, and
 the resonant frequency or the center frequency is within the transmit frequency band and lower than a center frequency of the transmit frequency band, and the other of the resonant frequency or the center frequency is within the transmit frequency band and is greater than the center frequency of the transmit frequency band.

8. The power amplifier circuit according to claim 7, wherein the resonant frequency of the LC parallel resonance circuit and the center frequency of the notch filter circuit are within a frequency band having a bandwidth that is ½ or less than a bandwidth of the transmit frequency band.

9. The power amplifier circuit according to claim 1, wherein, in at least one of the impedance circuits, the first impedance circuit or the second impedance circuit is an LC series resonance circuit comprising an inductive element and a capacitive element connected in series with each other between the signal input terminal and a reference potential, or connected between the bias-current output terminal and a reference potential.

10. The power amplifier circuit according to claim 9, wherein a resonant frequency of the LC series resonance circuit is within the transmit frequency band and is less than a center frequency of the transmit frequency band.

11. The power amplifier circuit according to claim 9, wherein a resonant frequency of the LC series resonance circuit is within the transmit frequency band and is greater than the center frequency of the transmit frequency band.

12. The power amplifier circuit according to claim 3, wherein a resonant frequency of the LC parallel resonance circuit is within the transmit frequency band and is less than a center frequency of the transmit frequency band.

13. The power amplifier circuit according to claim 3, wherein a resonant frequency of the LC parallel resonance circuit is within the transmit frequency band and is greater than the center frequency of the transmit frequency band.

14. The power amplifier circuit according to claim 1, wherein, in at least one of the impedance circuits, a circuit configuration of the first impedance circuit is different than a circuit configuration of the second impedance circuit.

15. The power amplifier circuit according to claim 1, wherein at least one of the amplifiers, at least one of the bias circuits, at least one of the first impedance circuits, and at least one of the second impedance circuits are formed on a single semiconductor chip.

\* \* \* \* \*